US007106230B2

United States Patent
Kushner et al.

(10) Patent No.: US 7,106,230 B2
(45) Date of Patent: Sep. 12, 2006

(54) ANALOG TO DIGITAL CONVERTER CALIBRATION VIA SYNCHRONOUS DEMODULATION

(75) Inventors: Lawrence J. Kushner, Andover, MA (US); Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

(21) Appl. No.: 10/870,330

(22) Filed: Jun. 17, 2004

(65) Prior Publication Data

US 2005/0280565 A1 Dec. 22, 2005

(51) Int. Cl.
*H03M 1/10* (2006.01)

(52) U.S. Cl. .................. 341/120; 341/118
(58) Field of Classification Search ........... 341/120, 341/118
See application file for complete search history.

(56) References Cited

U.S. PATENT DOCUMENTS

| | | | | |
|---|---|---|---|---|
| 5,844,415 | A * | 12/1998 | Gershenfeld et al. | 324/663 |
| 5,990,814 | A * | 11/1999 | Croman et al. | 341/118 |
| 6,587,061 | B1 * | 7/2003 | Petrofsky | 341/143 |
| 6,615,386 | B1 * | 9/2003 | Yano et al. | 714/780 |
| 6,735,535 | B1 * | 5/2004 | Kagan et al. | 702/61 |
| 6,850,563 | B1 * | 2/2005 | Hulyalkar et al. | 375/233 |

* cited by examiner

*Primary Examiner*—Rexford Barnie
*Assistant Examiner*—Joseph Lauture
(74) *Attorney, Agent, or Firm*—Hamilton, Brook, Smith & Reynolds, PC

(57) ABSTRACT

A technique for dynamically calibrating a successive approximation charge to digital converter by toggling at least some portion of the converter between two predetermined states, with the design goal of balancing the voltage and/or charge that is output in the two states. The two states are chosen such that they are expected to generate the same output voltage when the converter is in normal operation mode. If there is an imbalance, switching between the two calibration states invariably generates a square wave signal that toggles between two distinct values. A synchronous demodulator having a bandwidth centered at the toggle frequency can then be used to accurately detect an amount of error, which is then feedback to generate correction signals. The detected value of the error signal can in turn can be further integrated over time, to provide a correction value. If there are undesirable static offsets introduced by the synchronous demodulator or by the signal and/or charge levels output by the two differential halves of the converter, a properly timed latch can be used to further stabilize the error signal.

17 Claims, 7 Drawing Sheets

|       | 1/2 | 1/4 | 1/8 | ... | $1/2^i$ | $1/2^{i+1}$ |                |
|-------|-----|-----|-----|-----|---------|-------------|----------------|
| $DAC_P$ | 1   | 0   | 0   | ... | 0       | LSB[0]      | STATE A        |
| $DAC_M$ | 0   | 1   | 1   | ... | 1       | LSB[1]      | SWITCH CONTROLS |
|       |     |     |     |     |         |             |                |
| $DAC_P$ | 0   | 1   | 1   | ... | 1       | LSB[1]      | STATE B        |
| $DAC_M$ | 1   | 0   | 0   | ... | 0       | LSB[0]      | SWITCH CONTROLS |

FIG. 3

ANALOG TO DIGITAL CONVERTER CALIBRATION VIA SYNCHRONOUS DEMODULATION

BACKGROUND OF THE INVENTION

The present invention relates to calibrating Analog-to-Digital Converters (ADCs) or Digital-to-Analog Converters (DACs), especially those which use Charge Coupled Device (CCD) pipeline structures and successive approximation techniques.

Many modern electronic systems require conversion of signals from analog to digital or from digital to analog form. Circuits for performing these functions are now required in numerous common consumer devices such as digital cameras, cellular telephones, wireless data network equipment, audio devices such as MP3 players, and video equipment such as Digital Video Disk (DVD) players, High Definition Digital Television (HDTV) equipment, and numerous other products.

U.S. Pat. No. 4,375,059 issued to Schlig is an early example of a Charge Coupled Device (CCD) based converter. In that design, a number of charge storage stages are arranged as a serial pipeline register so that an input source charges pass from stage to stage down the pipeline. A reference charge generator and a charge splitter at each stage generate reference signals. A first of the reference signals is compared to a source charge that is temporarily stored at the stage. The comparison generates a binary one if the source charge is greater than or equal to the first reference charge, or a binary zero if this source charge is less than the first reference charge. If a binary one is generated, only the stored contents of the stage need pass through to the next successive stage. However, if a binary zero is generated, the stored contents of the stage are passed to a next successive stage, together with a second reference charge, in such a way that the stored charges are combined. Auxiliary buffer registers are provided to temporarily store the output bits of the comparators. This allows forming a digital word for each source charge packet as the packet and its associated charge components travel down the pipeline.

A further refinement in charge to digital converter design is found in U.S. Pat. No. 5,579,007 issued to Paul. In that arrangement, the pipeline produces a serial stream of both positive and negative signal charges corresponding to a differential signal. The differential signal structure provides improved sensitivity in the charge to voltage translation process, and thus increased dynamic range. The structure also exhibits reduce sensitivity to mismatches, by suppression of common mode noise signals in the charge domain.

In order to provide a high precision converter, the differential type successive approximation pipeline must often be trimmed or calibrated. The precision of the calibration apparatus must therefore be considerably better than the converter itself, making its design quite challenging.

Existing converter calibration techniques typically set the converter to a static state and then adjust one or more parameters of the pipeline to provide for Direct Current (DC) balance. These techniques usually require precise, low noise, low DC-offset amplifiers and/or comparators. Unfortunately, thermal noise and low frequency (1/f) noise can cause voltage offsets, which in turn often limit how accurately the converter can be calibrated.

SUMMARY OF THE INVENTION

The present invention is a technique for dynamically calibrating a successive approximation charge to digital converter by toggling at least some portion of the converter between two predetermined states, with the design goal of balancing the voltage and/or charge that is output in the two states. When the converter is out of balance, the voltages differ, producing an error signal.

In other words, the two states are chosen such that they are normally expected to generate the same output voltage, within the expected operating tolerance of the converter. If there is an imbalance, switching between the two states invariably generates a square wave signal that toggles between two distinct values. For example, the error signal itself changes state at the toggle rate. A synchronous demodulator having a bandwidth centered at the toggle frequency can then be used to accurately detect the amount of error, even in the presence of significant Direct Current (DC) voltage and low frequency (1/f) noise. The synchronous demodulator can be designed to be very narrow band, rejecting both low and high frequency signals as well as noise and DC offsets. The detected value of the error signal can in turn can be further integrated over time, to provide a correction value.

In a preferred embodiment, the synchronous demodulator is implemented with a mixer and a low pass filter. The mixer receives the error signal and a signal corresponding to the toggle rate. The low pass filter may be implemental with an integrator. In the case of small error signal amplitudes, this approach can obtain improved performance by increasing the integrator time constant.

If there are undesirable static offsets introduced by the synchronous demodulator itself or in the signal and/or charge levels output by the two differential halves of converter, a sawtooth waveform will result. This sawtooth ends up being superimposed on the normally linear ramp produced by the integrator. In further embodiments, therefore, a properly timed latch is coupled to the integrator output to remove the effect of the offset on the ramp. The latch ensures that the error signal is only sampled after a complete sawtooth up-down cycle time.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3 illustrates a set of switch control signals applied to the components of the converter pipeline to implement two states, each having nominally the same output value.

DETAILED DESCRIPTION OF THE INVENTION

A description of preferred embodiments of the invention follows.

Figure 1:
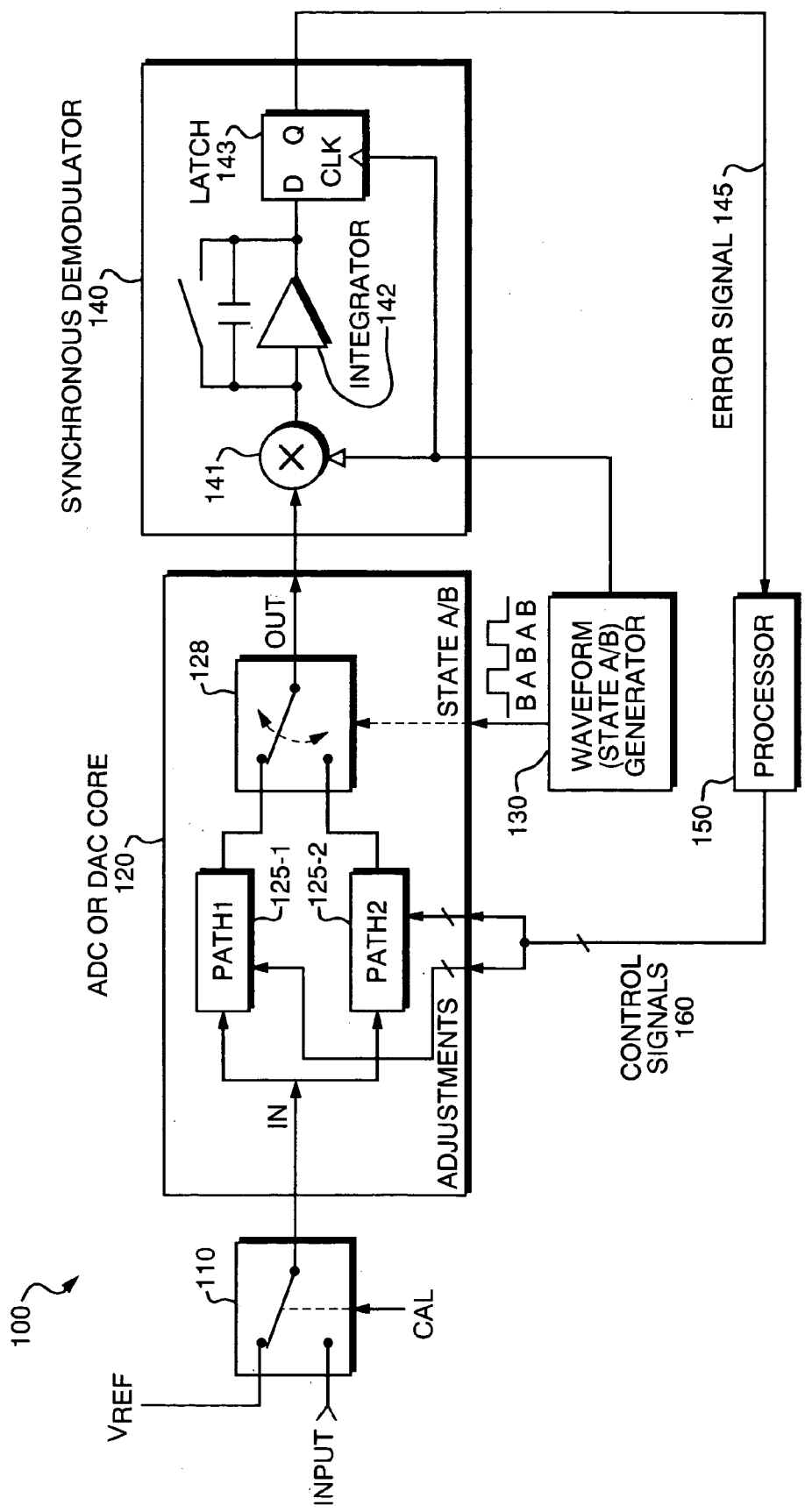
FIG. 1 is a high level block diagram of a charge-to-digital converter that uses the techniques of the present invention.

FIG. 1 is a high level illustration of a converter system 100 that operates according to principals of the present invention. The system 10 consists of an input switch 110, a converter core 120, state signal generator 130, a synchronous demodulator 140, and a processor 150. In general, the present invention is a technique for dynamically calibrating the converter core 120, which may be a successive approximation charge to digital converter, or some other voltage converter, by toggling at least some portion of the converter between two predetermined, nominally balanced, states (state A and state B).

The input switch 110 provides a converter input signal (IN) to a converter core 120. The converter input, IN, may be selected from either a system input voltage (INPUT), such as when the system 10 is running in its normal operating mode, or as a reference voltage ($V_{REF}$), such as when the system 10 is running in a calibration mode. The particular operating or calibration mode is selected by a switch control input signal, CAL.

In one preferred embodiment, the converter core 120 may have two physical signal paths 125-1 and 125-2 that represent the two states, state A and state B. In other preferred embodiments, the converter core 120 may have a single signal path that operates in two different modes to provide the two different states.

When in a calibration mode, the system 10 acts as a feedback loop that has a goal of balancing the output between the two predetermined states. When the converter core 120 is out of balance, the voltages and/or charges in the two states differ, producing an error signal 145.

The two states are chosen such that they are normally expected to generate the same output charge, OUT, at the output of the converter core 120. However, if the converter is not perfectly balanced, switching between the two states invariably generates a digital waveform signal OUT that actually toggles between two values, as either of the two paths are alternately selected by output switch 128.

The synchronous demodulator 140 has a bandwidth centered at the state A/B toggle frequency. Thus, the synchronous demodulator 140 can be used to accurately detect the amount of error, even in the presence of significant Direct Current (DC) voltage and low frequency (1/f) noise.

In preferred embodiments, the synchronous demodulator 140 can be a mixer and an integrator. The mixer 141 is typically a multipler or cross-coupled switches. The integrator 142 controls the bandwidth of the demodulator 140. It can be designed to be very narrow band, to reject both low and high frequency signals, as well as to reject noise and DC offsets.

The integrated value of the error signal can in turn be further latched 143, prior to the error signal 145 being fed to the processor 150. The processor 150 then uses the error signal to apply control signals 160 that adjust the operation of the two signal paths in the converter core.

Figure 2:
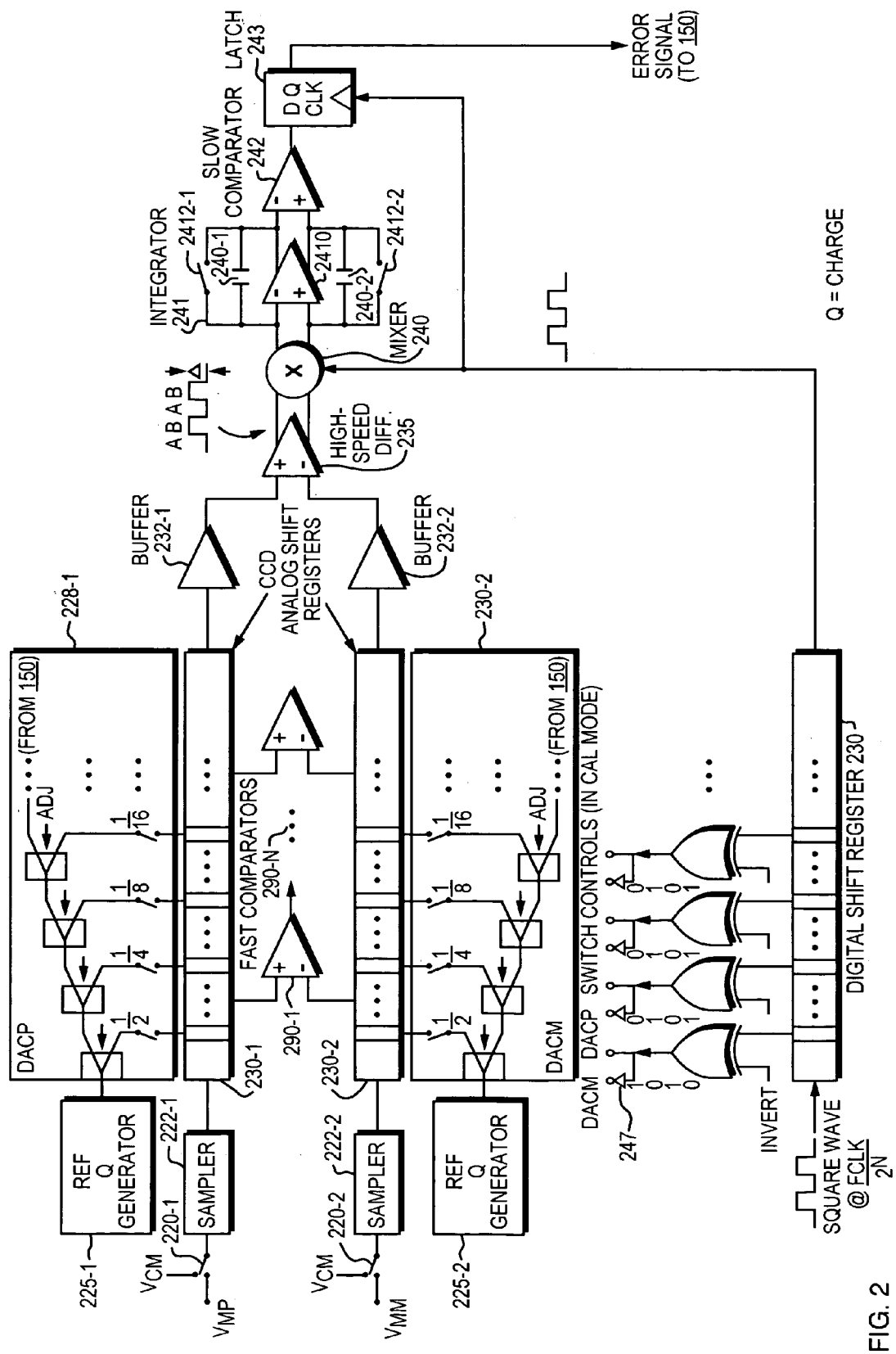
FIG. 2 is a more detailed view of the converter pipeline.

FIG. 2 is a more detailed diagram of one embodiment of the invention as applied to a so-called Charge Domain Converter (QDC) system 200 operating as an Analog to Digital Converter (ADC). This particular QDC 200 is a successive approximation type converter that uses a number of charge storage stages arranged as a serial pipeline register, so that an input source charge passes from stage to stage down the pipeline. A reference charge generator and a charge splitter at each stage generate reference signals which are optionally added to the charge as it travels down the pipeline. In the illustrated embodiment, there are actually two pipelines 230-1, 230-2 that produce a serial stream of both positive and negative signal charges corresponding to a differential signal at the pipeline outputs. The complimentary outputs are then fed to a differential amplifier 235. This converter core is implemented along the lines of the QDC described in the aforementioned U.S. Pat. No. 5,579,007 issued to Paul.

More particularly, an input voltage to be converted is presented as a complimentary pair of voltages, Vinp and Vinm, representing a positive (plus) and negative (minus) version of the input signal to be converted. Switches 220-1, 220-2, one for each of the plus and minus paths through the converter core, provide a selected input signal to a respective sampler, 222-1, 222-2. The samplers 222 each convert a respective input voltage to a charge. In normal operation mode of the QDC 200, these input signals are selected by the switches 220. In the calibration mode, however, the same common mode voltage, Vcm, is fed through the samplers 222 to each of the converter pipelines 230. In the preferred embodiment, Vcm, is equal to one-half the full scale input value. This is an input condition that results in the same nominal output value being provided by each of the plus and minus paths.

The charges output by the samplers 222-1, 222-2 are fed to the input stage of the respective charge pipeline 230-1, 230-2, which are implemented as Charge Coupled Device (CCD) type analog shift registers. Each of the plus and minus paths through the converter core 210 have a respective digital-to-analog (DAC) ladder DACp (230-1) or DACm (230-2).

Each ladder consists of reference charge generator 225-1, 225-2 and a series of adjustable charge splitters 226 (not individually numbered for the sake of clarity). There is an adjustable charge splitter 226 associated with each stage of each of the pipelines 230. The charge splitters 226 are arranged in series to couple (or, to not couple, depending upon the setting of a corresponding switch 227) a fractional amount of charge to the respective stage of the pipeline 230. Each successive splitter 226 provides one-half of the reference charge it receives to the next splitter in the chain. Thus, the string of splitters provide an amount of charge equal to $\frac{1}{2}, \frac{1}{4}, \frac{1}{8}, \frac{1}{16}, \ldots, \frac{1}{2^i}$ (where i is the number of stages in the pipeline) of the reference charge.

In normal operation of the converter core, a set of fast comparators 229, one for each stage of the pipeline (not shown in detail), provide an analog charge-to-digital conversion result.

However, of more interest to the present invention is operation in the calibration mode. In that mode, the switches 227 are controlled instead by a set of switch control signals 232 provided by a digital shift register 230. In the calibration mode, the switches 227 are configured so that the converter core may be operated in one of two states, state A or state B, that nominally each provide the same output charge. The system is operated in the calibration mode such that it changes between state A and state B at a calibration or "A/B" toggle rate. The A/B toggle rate can be any convenient frequency at which the components of the system operate properly.

Please note also that in the calibration mode an extra bit of the pipeline, beyond the Least Significant Bit (LSB) used in normal operation, is enabled for use. The extra stage beyond the nominal LSB, as will be understood shortly, is to provide the capability of two nominally equal output states, within the range of normal operation of the converter, but by actually using two different input states.

FIG. 3 illustrates the state of the switches 227 more particularly. As alluded to previously, the switches 227 are used to control the converter core so that it is toggled between two different states, state A and state B, that are expected to provide the same output value. In FIG. 3 a convention is adopted such that a binary 1 represents a switch control signal that places its corresponding switch 227 in the closed state, with a binary 0 representing a switch control signal that opens its corresponding switch.

In a first state A, illustrated in the top two lines of FIG. 3, the plus ladder or DACp is fed control signals 1 0 0 . . . 0 [0], with logic 1 being fed to control the switch for the first splitter 226 in the pipeline 230-1 (the one receiving ½ the reference charge), so that only that stage is permitted to feed charge to the pipeline 230-1. Please note a convention here of the bracketed value [0] indicating the logic state associated with the added bit which is the stage i+1$^{th}$ bit, beyond the LSB stage i. Also in state A, the minus ladder or DACm is fed control signals 0 1 1 . . . 1 [1], to allow all stages in pipeline 230-2 except the first to receive charge. Thus, in this state A, the differential amplifier 235 provides an output corresponding to the difference between these two input settings 1 0 0 . . . 0 [0] and 0 1 1 . . . 1 [1]. The additional bracketed bits force the outputs to be nominally the same, within the "normal mode" LSB resolution of the converter.

State B, illustrated in the bottom two lines of FIG. 3, represents a different state of the converter core that nominally provides the same output. In state B, the plus ladder DACp is fed control signals 0 1 1 . . . 1 [1], and the minus ladder DACm is fed control signals 1 0 0 . . . 0 [0]. Thus, in this state B, the differential amplifier 235 provides an output corresponding to the difference between these two input settings 0 1 1 . . . 1 [1] and 1 0 0 . . . 0 [0].

In the circuit of FIG. 3, these switch control signals are shown being generated by feeding a square wave at the A/B toggle clock frequency. These signals might be generated by a clock divider associated with each control line running at the A/B rate. However, a particular preferred embodiment of a switch control signal generator that uses a ring counter is useful when A/B is related to the clock frequency. This implementation for the switch control signal generator will be described below in connection with FIG. 7.

While the outputs in states A and B should nominally be the same, and thus the output of the differential amplifier 235 should be a constant value, in fact the output is a square wave, as illustrated, due to differences in the calibration of DACp and DACm.

As previously mentioned, mixer 240 and integrator 241 operate as a synchronous demodulator (driven by the A/B state signal fed to mixer 240) to detect the error signal and to drive the integrator 241 output to one voltage rail or the other (i.e., to the maximum plus or minimum minus value of the converter range).

Figure 4A:
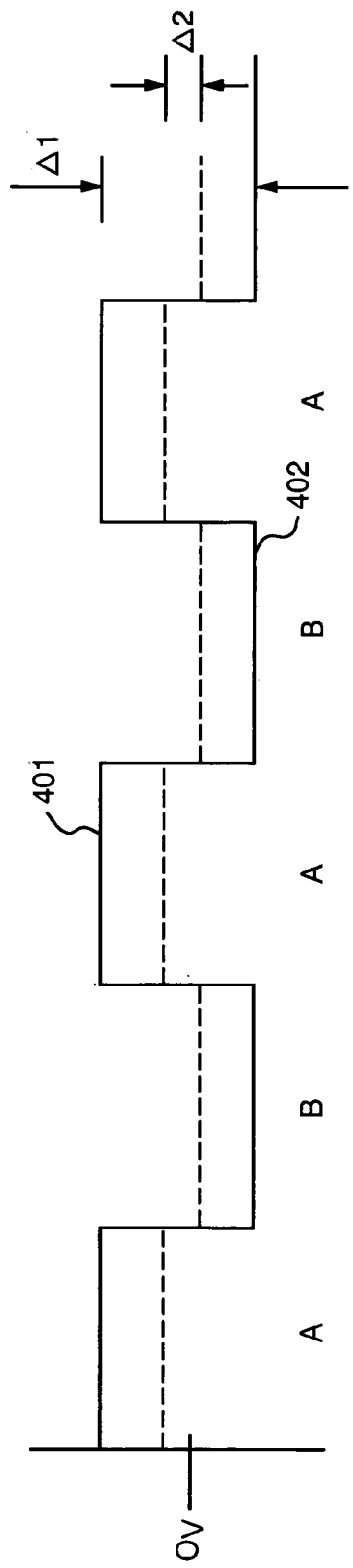
FIG. 4A illustrates a differential output signal for the two states, for two different operating conditions.

FIG. 4A illustrates a typical output of the integrator 241 for the plus ladder DACp, for two different operating conditions. A first condition, illustrated by the solid line square wave signal 401, alternates between two values at the A/B toggle rate. The difference in output between state A and state B under these conditions is A1. The dotted line square wave 402 illustrates the output under a different set of operating conditions, where the difference in output is A2.

Figure 4B:
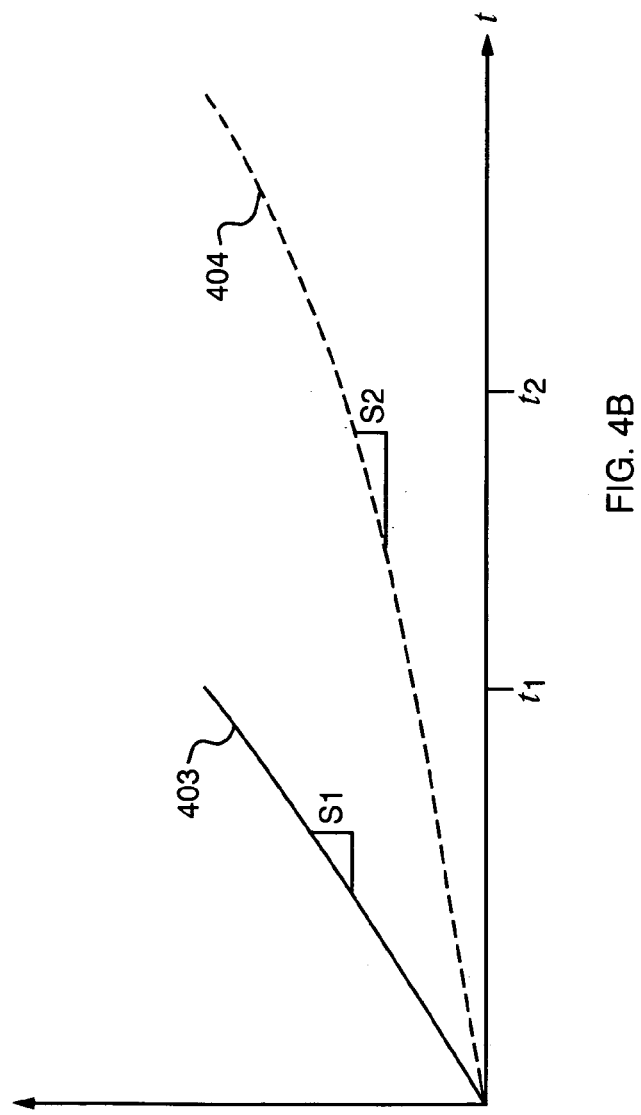
FIG. 4B illustrates the synchronous demodulator output for the two conditions.

FIG. 4B illustrates the output of the integrator 241 for the two conditions. In the first instance, illustrated by the solid line ramp signal 403, the integrator output ramps to a voltage rail at time t1 with slope s1. However, in the case of dotted line 404, the integrator output ramps more slowly with slope s2, to time t2. The synchronous demodulator 240 thus converges rapidly when the differential A/B output is large. However, it also permits resolution of smaller differences in A/B state output, by simply allowing a longer integration time.

Figure 5:
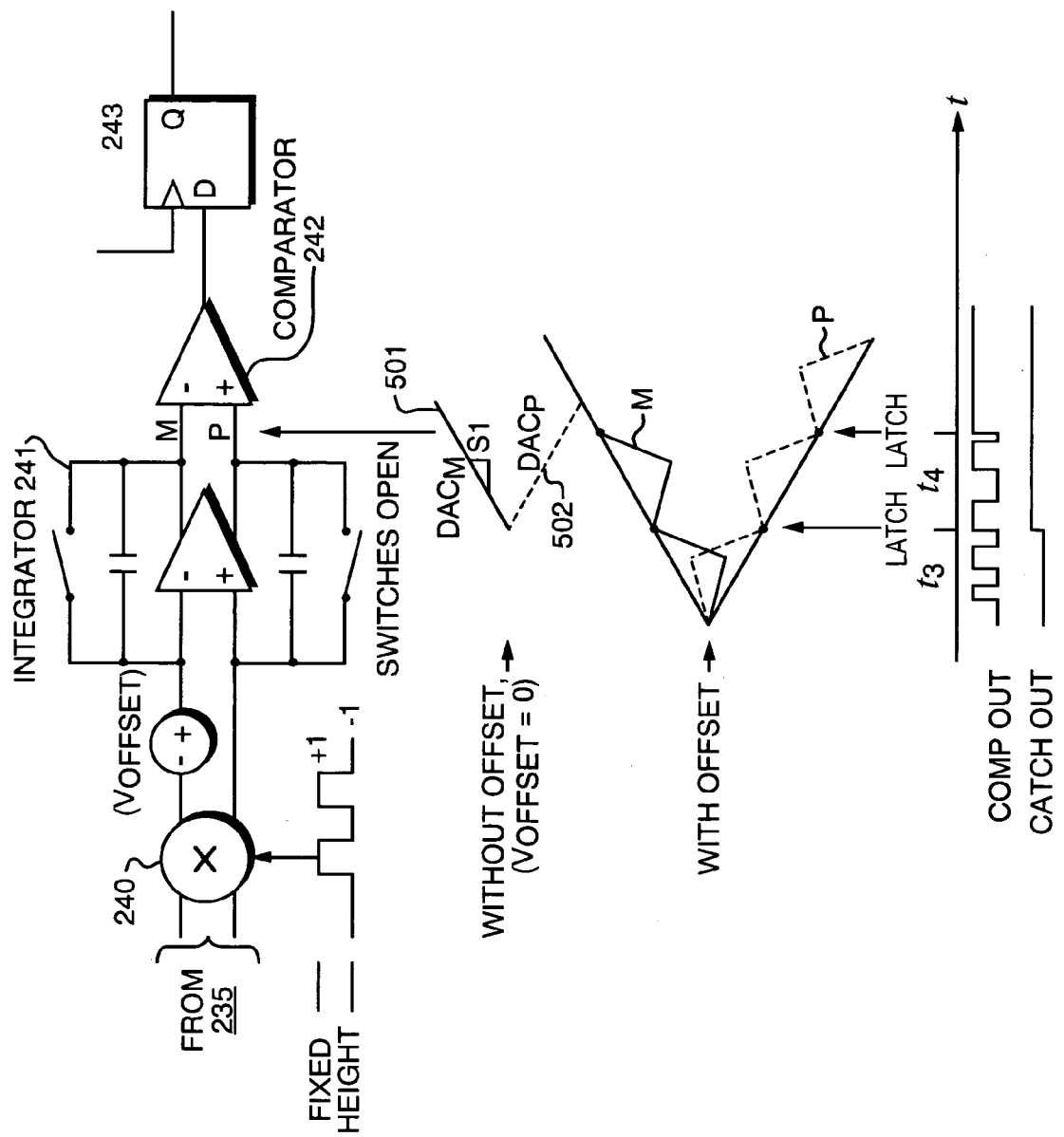
FIG. 5 is a more detailed view of an alternate embodiment of the synchronous demodulator combined with a chopper-stabilized amplifier.

FIG. 5 illustrates a phenomenon of the integrator and comparator in more detail, and the preference for including latch a242. In particular, consider a simple situation where there is no offset in calibration, and the pipelines 230 provide a perfect constant output in the calibration mode. In this scenario, the outputs of the integrator, on both the DACm branch and DACp ladders, will appear as an accumulation of this constant voltage, that is, as continuous ramp up and ramp down signals 051 and 502, as indicated by the dotted lines with slope s1.

However, consider when the components of the system introduce an offset in the mixer 240 output. There are several possible sources for the offset, either in the synchronous demodulator itself, or more likely, differences introduced by the two paths 125-1, 125-2 through the converter core. As indicated by the solid line signals 503 and 504, the simple ramps now have a further sawtooth-like modulation impressed upon them, with the period of the sawtooth corresponding to the A/B toggle rate. Eventually, at time t4, the ramp will remain above the impressed sawtooth. The ramp will actually oscillate above and below sawtooth for a while after time t3, producing an unambiguous error signal. By adding the latch 243 timed to sample the sawtooth on the edge of the A/B clock periods, this effect can be minimized. This is evident from the timing diagrams for the comparator output (COMP OUT), and latch output (LATCH OUT), showers the latch-stabilized error signal 145.

Processor 150 then receives the output of latch 243 and determines the values of adjustment signals applied to the adjustable splitters 230. If the latch output is equal to a logic 1, then the processor 150 will set the values of these signals to cause one or more of the splitters 230 to adjust a certain amount in one direction. If the latch output is equal to a logic value Ø, then the signals are set to values that adjust one or more splitters 230 in the other direction. The processor 150 may use any convenient algorithm to converge to a splitter adjustment solution, including, but not limited to a binary search or a linear search.

Certain converter configurations advantageously make use of chopper stabilization for normal mode operation of the differential amplifier 235. With this type of amplifier, DC offsets and low frequency 1/f noise are essentially removed, because the signal is shifted above DC. In these configurations, some of the circuitry used in a typical chopper-stabilized amplifier can be used to implement portions of the synchronous demodulator.

Figure 6:
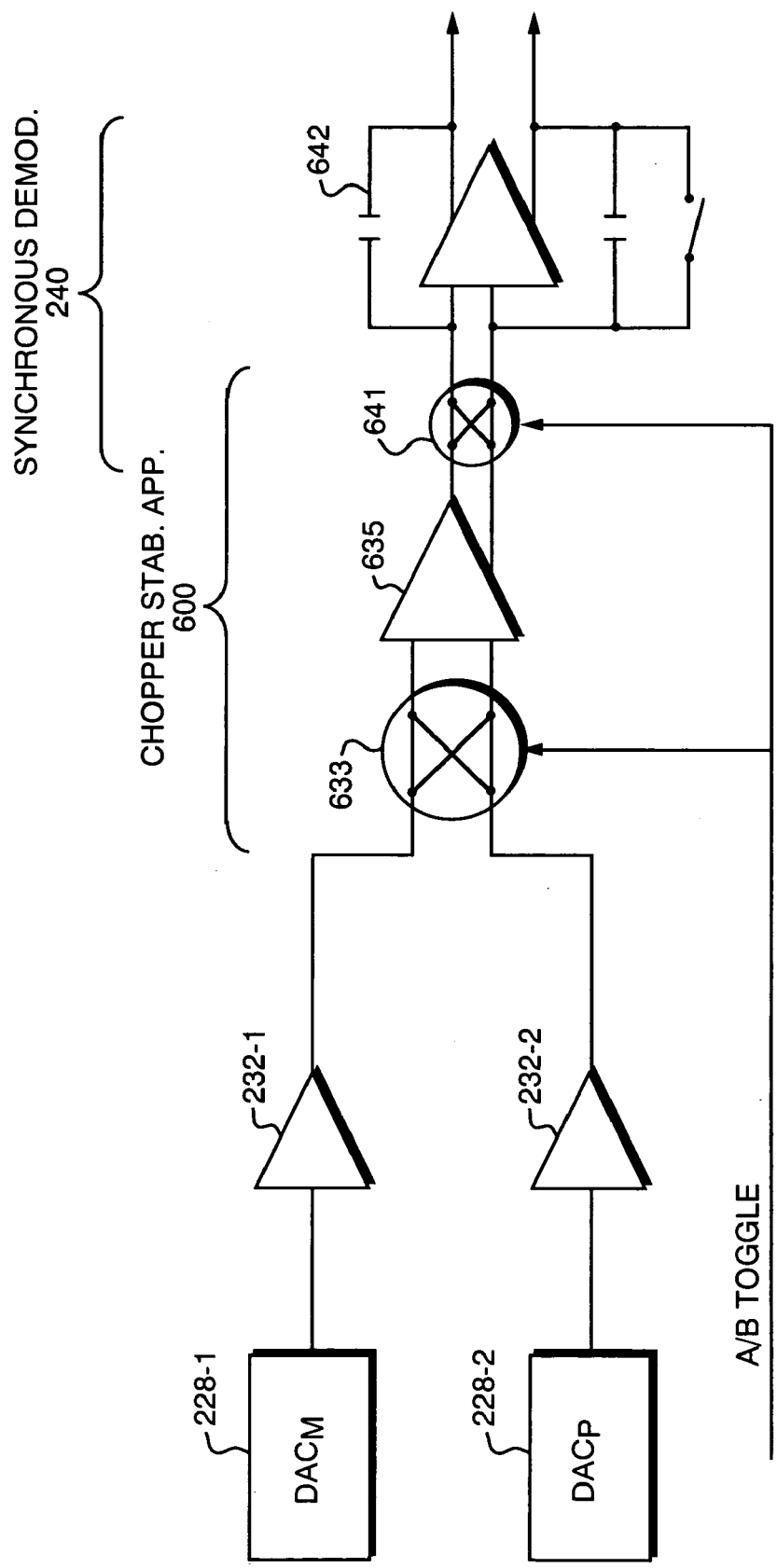
FIG. 6 is a signal diagram showing the integrator output before and after being latched.

FIG. 6 is a schematic diagram illustrating one such possible embodiment. As before, the outputs of the DACm and DACp channels are provided by the buffer amplifiers 232-1 and 232-2, respectively. The chopper stabilized amplifier 600 consults of mixer 633, differential amplifier 635 and output mixer 640. To stabilize the converter output in normal operation mode, the first mixer 633 up-converts any DC signal received from the input buffer amplifiers 232-1 and 232-2, up to some predetermined carrier. Differential amplifier 635 in turn operates to take a difference at a frequency higher than DC, avoiding the introduction of further DC noise or low frequency 1/f noise. The output mixer 240 then down-converts the differential amplifier output back to DC.

It is therefore quite evident that a synchronous demodulator needed for the calibration mode shares many components of the chopper stabilized amplifier 600 used in the normal operation mode. In other words, amplifier 635 can serve to function as the high speed differential amplifier 235 need for the calibration mode of FIG. 2, and mixer 640 can serve as the mixer 240. The first mixer 633 and second mixer 640 are each fed the A/B toggle signal. The additional mixer 633 on the input can be set to merely pass through the signals output by the buffers 232-1, 232-2. In the case of a multiplier implementation, it can be set to multiply by a value of 1.

Figure 7:
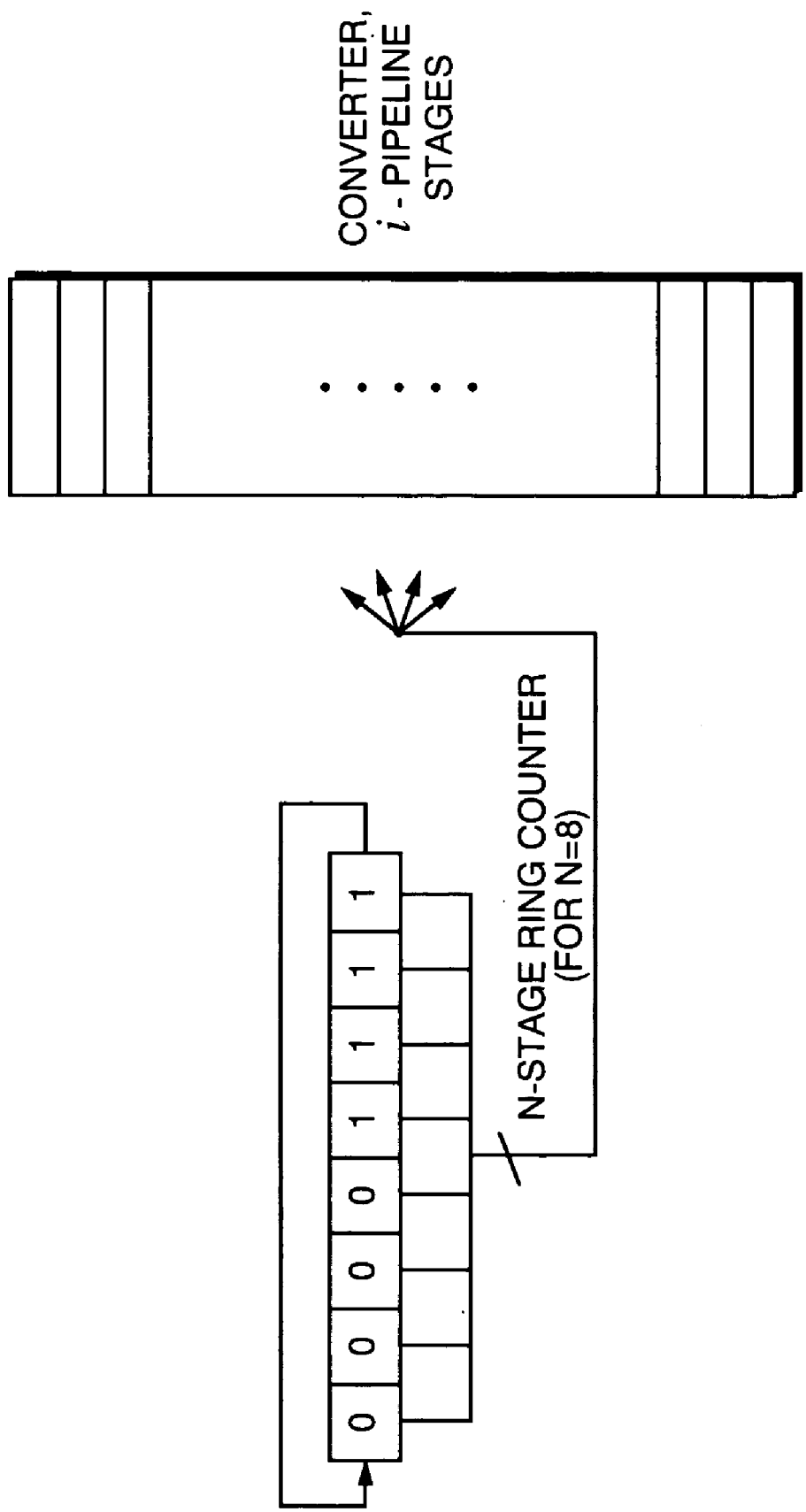
FIG. 7 illustrates a ring counter implementation for the switch control signal generator.

Finally, FIG. 7 shows a more detailed view of a possible refinement for the switch control signal generator. If the pipeline has 36 stages, for example, 36 flip flops would be required to drive the control signal outputs in each branch. Careful study of the sequence of bits produced by the digital shift register 230 reveal that they are actually square waves of differing phases. For a converter with many pipeline stages, the control signals can be more efficiently generated by a ring divider instead of many flip-flops, and prudent selection of the A/B toggle rate.

For example, if the A/B toggle rate is $1/16^{th}$ of the pipeline clock rate, then all phases of the required 8-bit on then 8-bit off waveforms can be generated with a single ring counter having only 8 flip flops. The necessary control signals can then be selected from the proper phase output of the ring counter, regardless of how many pipeline stages there are.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for calibrating a digital converter comprising the steps of:
    toggling at least some portion of the converter between at least two predetermined calibration states in a calibration mode, with each of the two predetermined calibration states providing a predetermined output signal;
    providing a converter output signal over a sequence of multiple predetermined calibration states; and
    synchronously demodulating the converter output signal
    wherein the toggling step is performed at a state toggle frequency, and a bandwidth of the synchronous demodulating step is centered at the state toggle frequency.

2. A method as in claim 1 wherein each of predetermined calibration states provide nominally the same converter output signal.

3. A method as in claim 1 additionally comprising:
    using the demodulated converter output signal to provide a correction signal to the converter.

4. A method as in claim 1 wherein the converter is a successive approximation converter.

5. A method as in claim 1 wherein the converter is a complimentary type converter having two conversion signal paths therein, with a first conversion signal path operating as a plus signal path and a second path operation as a minus signal path.

6. A method as in claim 5 wherein
    a first one of the two predetermined calibration states is provided by applying a first set of calibration inputs to the plus signal path and a second set of calibration inputs to the minus signal path; and
    a second one of the two predetermined calibration states is provided by applying the same second set of calibration inputs to the plus signal path and the same first set of calibration inputs to the minus signal path.

7. A method as in claim 6 wherein a common reference input, Vcm, is fed to the plus signal path and the minus signal path.

8. A method as in claim 1 wherein the step of synchronously demodulating further comprises:
    integrating the converter output signal to provide an error signal.

9. A method as in claim 1, additionally comprises
    chopper stabilizing at least one component of the digital converter during an operating mode.

10. A method as in claim 9 additionally comprising:
    while in the calibration mode, operating a portion of a circuit used in the chopper stabilizing step as part of the synchronous demodulating step.

11. A method for calibrating a digital converter comprising the steps of:
    toggling at least some portion of the converter between at least two predetermined calibration states in a calibration mode, with each of the two predetermined calibration states providing a predetermined output signal;
    providing a converter output signal over a sequence of multiple predetermined calibration states; and
    synchronously demodulating the converter output signal;
    wherein the step of synchronously demodulating further comprises:
        integrating the converter output signal to provide an error signal,
    wherein the error signal is generally a ramp type waveform in the absence of noise.

12. A method as in claim 11 wherein offset voltages introduced by the converter superimpose a sawtooth type waveform on the ramp waveform.

13. A method as in claim 12 additionally comprises:
    latching the integrated demodulated signal, in synchronism with the change of state of the converter, to produce the error signal.

14. A method for calibrating a digital converter comprising the steps of:
    toggling at least some portion of the converter between at least two predetermined calibration states in a calibration mode, with each of the two predetermined calibration states providing a predetermined output signal;
    providing a converter output signal over a sequence of multiple predetermined calibration states;
    synchronously demodulating the converter output signal;
    wherein the converter is a complimentary type converter having two conversion signal paths therein, with a first conversion signal path operating as a plus signal path and as second conversion signal path operating as a minus signal path;
    a first one of the two predetermined calibration states is provided by applying a first set of calibration inputs to the plus signal path and a second set of calibration inputs to the minus signal path; and
    a second one of the two predetermined calibration states is provided by applying the same second set of calibration inputs to the plus signal path and the same first set of calibration inputs to the minus signal path; and wherein a number of stages used by the digital converter in the calibration mode is at least one stage greater than the number of stages of the converter used in an operation mode.

15. A method for calibrating a digital converter comprising the steps of:

toggling at least some portion of the converter between at least two predetermined calibration states in a calibration mode, with each of the two predetermined calibration states providing a predetermined output signal;

providing a converter output signal over a sequence of multiple predetermined calibration states;

synchronously demodulating the converter output signal;

wherein the converter is a complimentary type converter having two conversion signal paths therein, with a first conversion signal path operating as a plus signal path, and a second conversion signal path operating as a minus signal path; and wherein the two conversion signal paths are pipelined Charge Coupled Device (CCD) stages.

16. A method as in claim 15 wherein the calibration inputs are fed to a respective set of adjustable charge splitters, with a charge splitter associated with a corresponding one of the pipeline stages.

17. A method as in claim 16 additionally comprising:

generating an error signal from the synchronously demodulated converter output signal; and deriving adjustment signals for controlling the adjustable splitters from the error signal.

* * * * *